United States Patent
Dalir et al.

(10) Patent No.: US 10,658,815 B1
(45) Date of Patent: May 19, 2020

(54) OPTICAL DEVICES WITH TRANSVERSE-COUPLED-CAVITY

(71) Applicant: Avago Technologies International Sales Pte. Limited, Singapore (SG)

(72) Inventors: Hamed Dalir, Austin, TX (US); Moustafa Farghal Ahmed, Minia (EG); Ray T. Chen, Austin, TX (US)

(73) Assignee: Avago Technologies International Sales Pte. Limited (SG)

( * ) Notice: Subject to any disclaimer, the term of this patent is extended or adjusted under 35 U.S.C. 154(b) by 0 days.

(21) Appl. No.: 16/267,941

(22) Filed: Feb. 5, 2019

(51) Int. Cl.
*H01S 5/10* (2006.01)
*H01S 5/026* (2006.01)
*H01S 5/183* (2006.01)
*H01S 5/343* (2006.01)

(52) U.S. Cl.
CPC ........... *H01S 5/1021* (2013.01); *H01S 5/026* (2013.01); *H01S 5/1039* (2013.01); *H01S 5/1042* (2013.01); *H01S 5/183* (2013.01); *H01S 5/3432* (2013.01)

(58) Field of Classification Search
CPC ...... H01S 5/1021; H01S 5/026; H01S 5/1039; H01S 5/1042; H01S 5/183; H01S 5/3432; H01S 5/125
See application file for complete search history.

(56) References Cited

U.S. PATENT DOCUMENTS

2011/0127547 A1* 6/2011 Wang ................ B82Y 20/00
257/84

* cited by examiner

*Primary Examiner* — Armando Rodriguez
(74) *Attorney, Agent, or Firm* — Sheridan Ross P.C.

(57) ABSTRACT

A light-emitting device is provided. The light-emitting device can include a main cavity formed within an epitaxial structure that is configured to generate light in response to having an electrical current provided thereto. The light-emitting device can also include a plurality of feedback cavities also formed within the epitaxial structure, where each of the plurality of feedback cavities are transversely-coupled with the main cavity to receive light from the main cavity and reflect at least some feedback light back into the main cavity. The light-emitting device may provide enhanced modulation bandwidth or ultra-high speed communication capabilities.

20 Claims, 10 Drawing Sheets

OPTICAL DEVICES WITH TRANSVERSE-COUPLED-CAVITY

FIELD OF THE DISCLOSURE

Example embodiments are generally directed toward optical devices with light confining structures.

BACKGROUND

Vertical-Cavity Surface-Emitting Lasers (VCSELs) have been successfully deployed in high-speed data communication for several generations of data rates. However, VCSELs with conventional designs may have an inherent relaxation-oscillation-frequency limited bandwidth to prevent it from being used for greater than 50 GBaud applications.

BRIEF DESCRIPTION OF THE DRAWINGS

Inventive concepts are described in conjunction with the appended figures, which are not necessarily drawn to scale.

DETAILED DESCRIPTION

Figure 1:
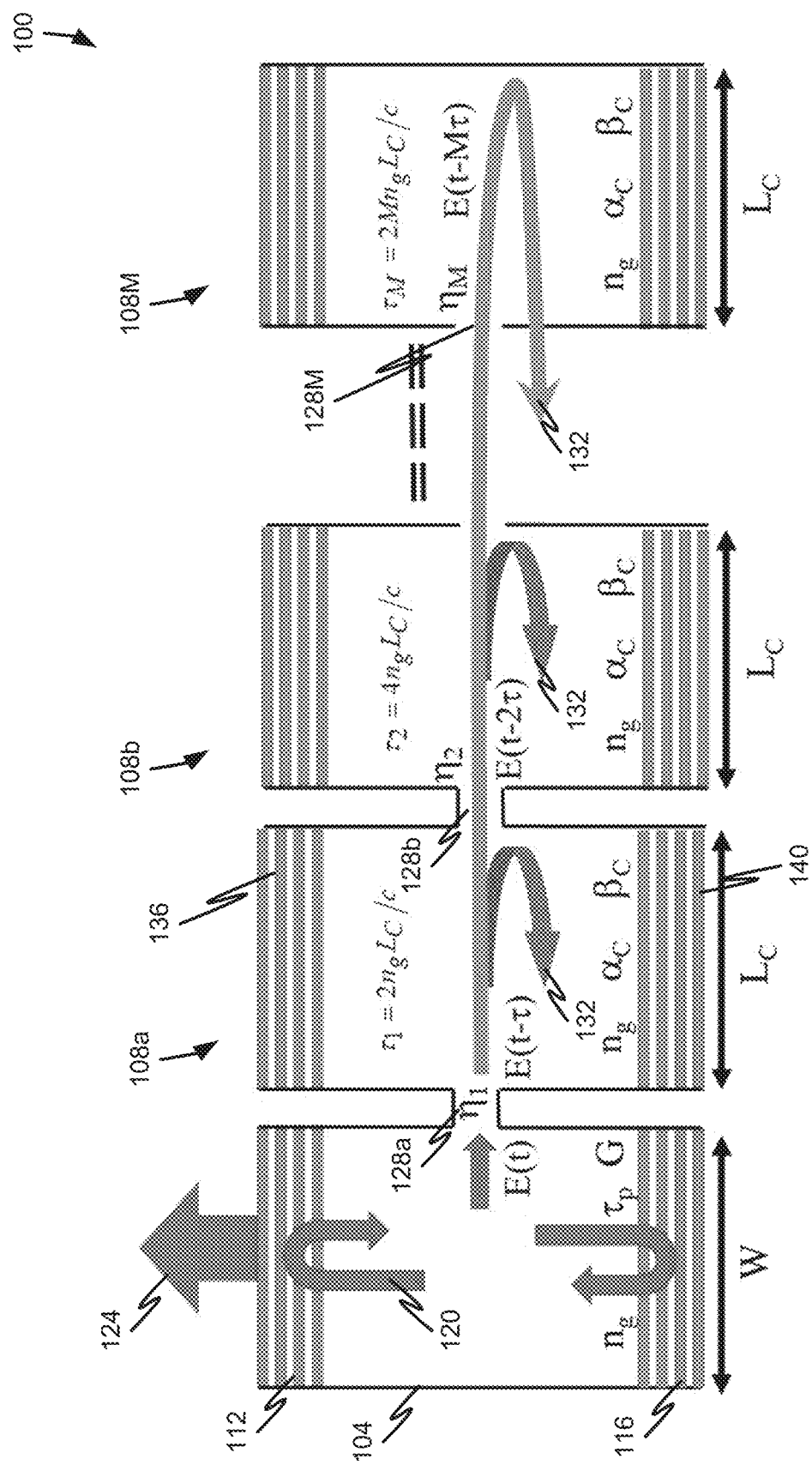
FIG. 1 illustrates a light-emitting device in accordance with at least some embodiments of the present disclosure.

In general, VCSELs are comprised of an active region (or cavity region) sandwiched between two distributed Bragg reflector (DBR) structures that include multiple pairs of alternating low and high refractive index material to generate high reflectance at the desired emission wavelength. The cavity region contains the light-emitting gain material, for example, quantum wells separated by barriers and bounded on both sides by cladding layers that also act as barriers for carriers. As the industry develops, there is an increasing demand for VCSELs with enhanced bandwidth and performance capabilities.

The ensuing description provides example embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

FIG. 1 illustrates an optical system according to at least one example embodiment. Specifically, FIG. 1 illustrates a light-emitting device 100, which may be in the form of a VCSEL, for example. The light-emitting device 100 is shown to include a main light-emitting cavity 104 (or main cavity for ease of conversation), and a plurality of feedback cavities 108a-M. It should be appreciated that the light-emitting device 100 may include any number, M, of feedback cavities 108 without departing from the scope of the present disclosure, where M can be any integer value that is greater than or equal to one. In some embodiments, the light-emitting device 100 may include a single feedback cavity 108 whereas, in other embodiments, the light-emitting device 100 may include two, three, four, five, six, seven, eight, or more light-emitting cavities 108. One, some, or all of the feedback cavities 108a-M may be transverse-coupled with the main cavity 104.

In some embodiments, the addition of a single transverse-coupled-feedback-cavity to the main cavity 104 can increase the modulation bandwidth of the light-emitting device 100. In some embodiments, the feedback cavities 108a-M are provided to control the feedback delay time from the transverse-coupled feedback cavities 108a-M, which implies the use of a photon-photon resonance (PPR) effect. It has been shown, however, that strong PPR produces undesirable peaky structures in the modulation frequency response, and that such bandwidth enhancement effect is sensitive to coupling strength variation. Moreover, it has been shown that a shorter feedback cavity length, while avoiding the pitfalls of PPR by inducing only the carrier-photon-resonance (CPR) effect, requires strong coupling to achieve the same bandwidth enhancement as that by a long cavity. With the above in mind, embodiments of the present disclosure propose the use of multiple, short (e.g., whose length, $L_C<10$ μm) feedback cavities 108a-M to achieve the strong coupling for large bandwidth increase while avoiding inducing ill-behaved PPR effects.

As shown in FIG. 1, the light-emitting device 100 may include the main cavity 104 coupled with a plurality of feedback cavities 108a-M via one or more coupling 128a-M. In some embodiments, each feedback cavity 108 is coupled separately and distinctly with the main cavity 104 by a different coupling 128a-M. Thus, the number, M, of couplings 128a-M provided in the light-emitting device 100 may equal the number, M, of feedback cavities 108a-M provided in the light-emitting device 100.

In some embodiments, the feedback cavities 108a-M may provide a distributed feedback. Each of the feedback cavities 108a-M may correspond to a relatively short feedback cavity that does not produce the undesirable "resonant modulation" characteristic of a long single feedback cavity (e.g., a feedback cavity whose length, LC is greater than 20 μm. Although FIG. 1 depicts the feedback cavities 108a-M as being cascaded in a straight line, it should be appreciated that embodiments of the present disclosure are not so limited. For instance, the feedback cavities 108a-M may be cascaded in a curved or arcuate fashion to reduce an overall footprint of the light-emitting device 100.

As shown in FIG. 1, the main cavity 104 may include a first doped region 112 and a second doped region 116 between which internal light 120 is generated. In some embodiments, an amount of the internal light 120 is initially emitted out of the main cavity 104 as emitted light 124 whereas other portions of the internal light 120 may pass through one or more of the couplings 128a-M. Once the internal light 120 has passed through a coupling 128, the light 120 may then be reflected within the feedback cavity 108 and may be considered feedback light 132 that is either retained within the feedback cavity 108 or feedback to the main cavity 104.

In some embodiments, in the main cavity 104, light 120 is confined from top and bottom. So, light 120 travels in zigzag with an angle in the lateral direction, and this angle is close to 90° near the cut-off condition of light propagation in the lateral direction. That is, light travels perpendicularly and is slowed in the laterally-coupled feedback cavities 108a-M. Within each feedback cavity 108, the slow light propagates with group velocity of $v_g=c/n_g$, where $n_g=fn$ is the group index with n being the average material refractive index and f is the slow factor of light. At the aperture of any particular feedback cavity (e.g., 108m), the slow light is partially transmitted to the following (m+1)th feedback cavity 108m+1, and is partially reflected back and coupled to the preceding (m−1)th feedback cavity 108m−1.

At the last feedback cavity 108M, the slow light is totally reflected back and propagates back toward the main cavity 104. The coupling ratio of slow light into every feedback cavity 108a-M may be defined as η. Within each feedback cavity 108a-M, the forth and back propagating slow light suffer loss of $\exp(-2\alpha_C L_C)$ and phase delay of $\exp(-2j\beta_C L_C)$, where $\alpha_C=f_k$ and $\beta_C=2\pi n/(\lambda f)$ are the lateral optical loss and propagation constant with k being the material loss and λ the emission wavelength. The period of the round trip between the main cavity 104 and the far end of the Mth feedback cavity 108M is $\tau_m=2\pi_g m L_C/C$.

In some embodiments, the width W of the main cavity 104 may be similar or identical to the length $L_C$ of each feedback cavity 108a-M. In some embodiments, the length $L_C$ of each feedback cavity 108a-M is the same as other feedback cavities, whereas in other embodiments such length may vary from one feedback cavity 108 to another feedback cavity 108. As a non-limiting example, the width W of the main cavity 104 may be on the order of approximately 4 μm, but no larger than 10 μm.

In some embodiments, each feedback cavity 108a-M may have a similar construction to the main cavity 104. For instance, each feedback cavity 108a-M may have a first doped region 136 and second doped region 140 that is similar or identical in construction, layers, size, doping, etc., to the first doped region 112 and second doped region 116, respectively. In some embodiments, the first doped region 112, 136 of both cavities may correspond to a p-doped region and the second doped region 116, 140 of both cavities may correspond to an n-doped region. More specifically, but without intending to limit embodiments described herein, a first distributed Bragg reflector (DBR) stack may be provided as the first doped regions 112, 136 and a second DBR stack may be provided as the second doped regions 116, 140. In some embodiments, a quantum well (QW) region may reside between the first and second DBR stacks and the QW region may include at least one quantum well structure with a light-emitting material that emits light in the presence of an applied electrical current. For example, the QW structure may include a layer of a semiconductor material (e.g., GaAs) sandwiched between two layers of material having a wider band gap (e.g., AlGaAs) than the semiconductor material.

As will be discussed in further detail herein, the main cavity 104 may be configured to emit light 124 whereas the feedback cavities 108a-M may be capped or otherwise prohibited from allowing light 132 to escape vertically in either direction (e.g., up or down). Rather, the feedback cavities 108a-M may be constructed to only allow transversely-propagating light to pass through the coupling 128 into an adjacent cavity 104, 108.

Figure 2A:
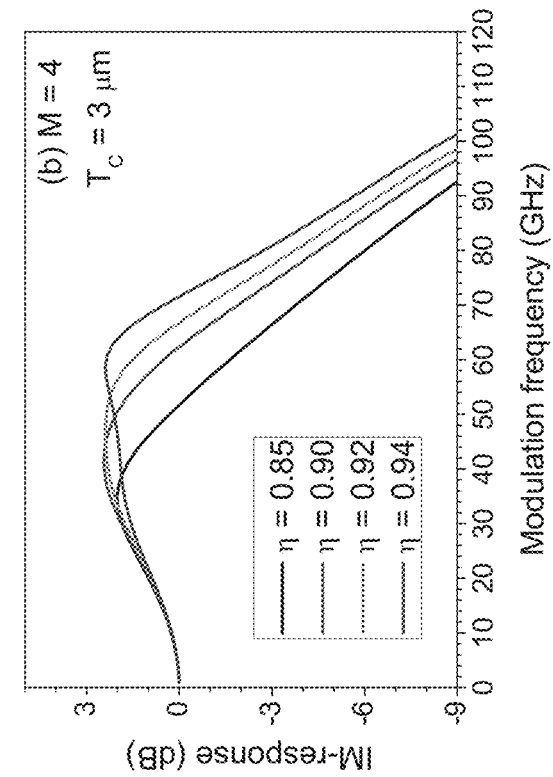
FIG. 2A is a chart illustrating a first light-emitting device's modulation frequency response in accordance with at least some embodiments of the present disclosure.
Figure 2B:
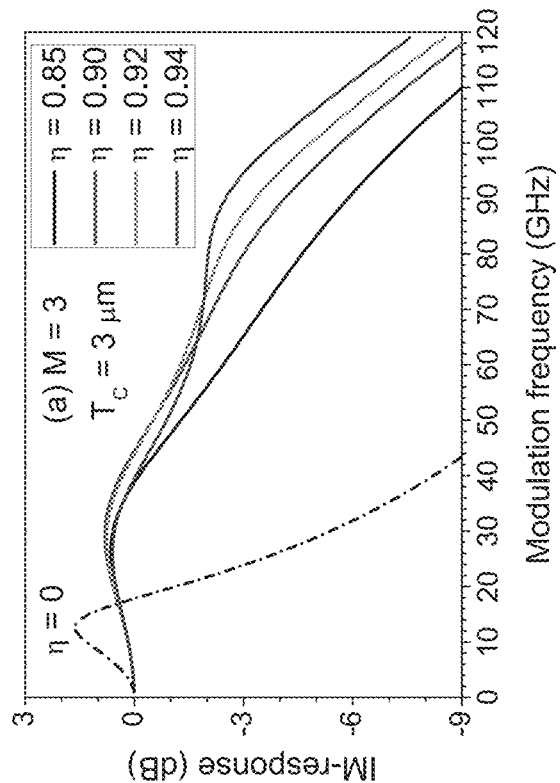
FIG. 2B is a chart illustrating a second light-emitting device's modulation frequency response in accordance with at least some embodiments of the present disclosure.

As shown in FIGS. 2A and 2B, the design of the light-emitting device 100 exhibits a desirable modulation frequency response with bandwidth enhancement. Specifically, FIG. 2A illustrates a design of the light-emitting device 100 where M=3 and FIG. 2B illustrates a design of the light-emitting device 100 where M=4. In both designs, the light-emitting device 100 exhibits a well-behaved modulation frequency response and there is substantially no observation of undesirable peaky structures characteristic of PPR.

Figure 3:
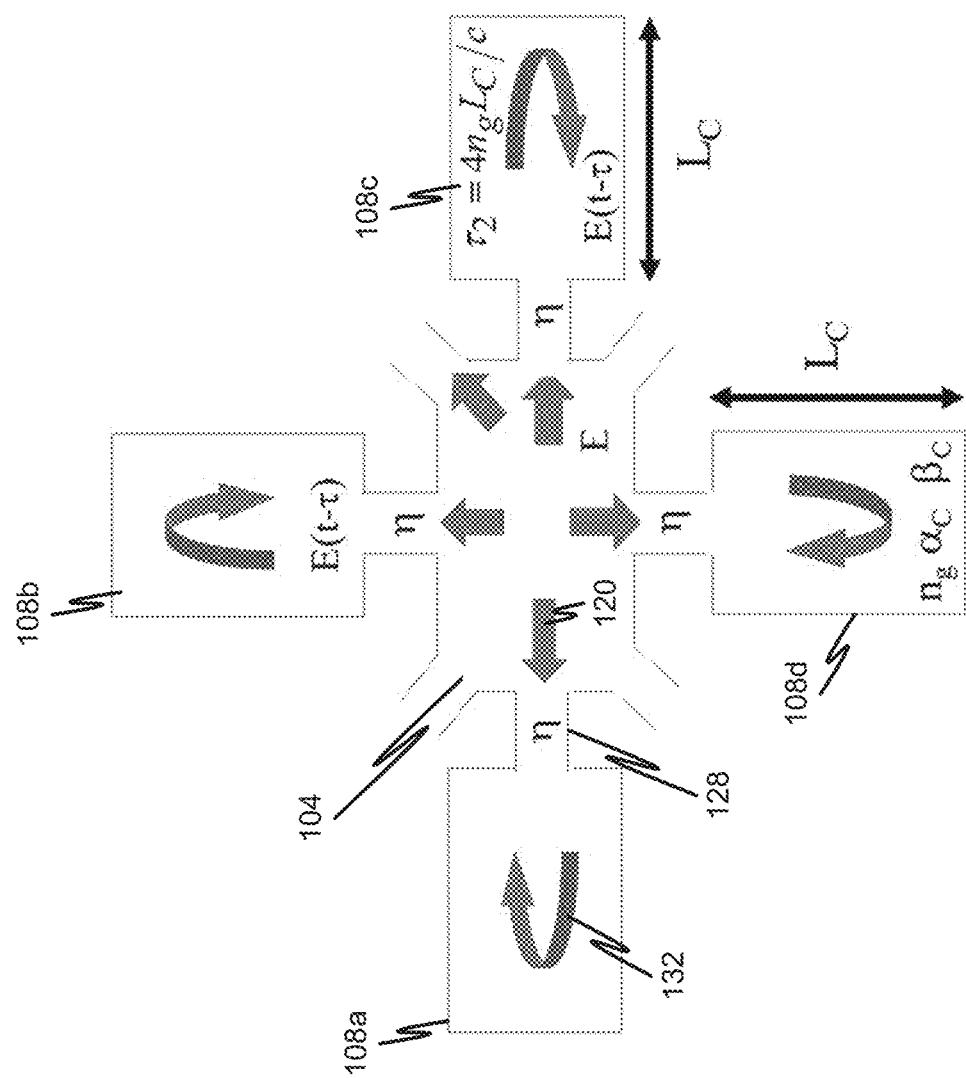
FIG. 3 is a top view of a light-emitting device in accordance with at least some embodiments of the present disclosure.

With reference now to FIG. 3, a further possible configuration of a light-emitting device 100 will be described in accordance with at least some embodiments of the present disclosure. In particular, FIG. 3 shows the light-emitting device 100 to include four feedback cavities 108a, 108b, 108c, and 108d. Each feedback cavity 108a-d is directly coupled with the main cavity 104 via a corresponding coupling 128. Thus, the light-emitting device 100 exhibits four couplings 128, one for each feedback cavity 108a-d.

In some embodiments, the configuration of the feedback cavities 108a-d about the main cavity 104 may be substantially symmetrical. In other words, any line drawn through the middle of the main cavity 104 and within the plane of the paper will have an equal amount of feedback cavity area (or volume) on one side of the line as on the other side of the line. In some embodiments, the construction of each feedback cavity 108 may be identical to the construction of other feedback cavities 108.

The design of the light-emitting device 100 in FIG. 3 shows a possible alternative to the design of the light-emitting device 100 in FIG. 1, but it should be appreciated that either design (or other designs) may be used without departing from the scope of the present disclosure. The view of the light-emitting device 100 in FIG. 3 corresponds to a top view of the device 100, rather than the cross-sectional view of a device 100 provided by FIG. 1.

The remote end feedback cavities (e.g., the Mth feedback cavity 108M) in a chain of cascaded feedback cavities, such as shown in FIG. 1, may exhibit too high a loss to contribute effectively to the bandwidth enhancement effect. It should be noted that long single feedback cavities 108 may suffer the same effectiveness problem, but still may be better than a light-emitting device 100 without a feedback cavity. In accordance with at least some embodiments, and as shown in FIG. 3, arranging multiple feedback cavities 108 of an appropriate length (e.g., with $L_C$ being approximately equal to or less than 10 μm), with each having a direct connection to provide feedback to the emitting main cavity 104 may be more effective. This means that a modest, readily realizable coupling strength, e.g., η=0.5, can be used in the design.

Figure 4B:
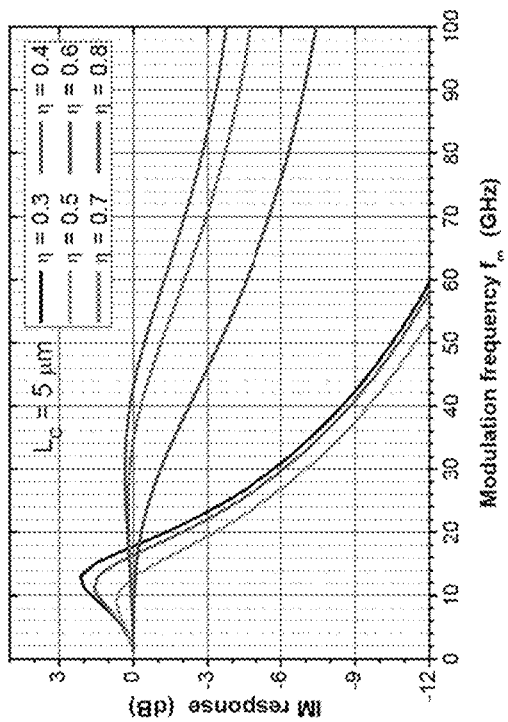
FIG. 4B is a chart illustrating yet another light-emitting device's modulation frequency response in accordance with at least some embodiments of the present disclosure.
Figure 4A:
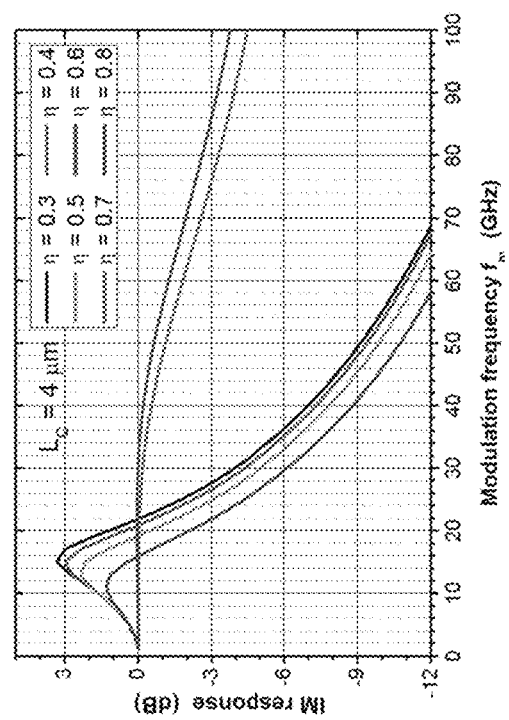
FIG. 4A is a chart illustrating another light-emitting device's modulation frequency response in accordance with at least some embodiments of the present disclosure.

As shown in FIGS. 4A and 4B, the design of the light-emitting device 100 according to the configuration shown in FIG. 3 (e.g., with multiple feedback cavities 108a-d directly coupled with the main cavity 104) exhibits a desirable modulation frequency response. Specifically, FIGS. 4A and 4B both shown illustrative modulation frequency responses for the design of the light-emitting device 100 shown in FIG. 3. Both FIGS. 4A and 4B also show that the use of more than two feedback cavities 108 results in a better overall behavior of the light-emitting device 100. Both figures show that (a) bandwidth enhancement increases with the number of feedback cavities and (b) the same or larger bandwidth enhancement can be produced with lower coupling strength compared to the cascaded design, but the cascaded design of FIG. 1 still produces a desirable modulation frequency response.

With reference now to FIGS. 5-9, additional details of possible configurations or designs of light-emitting devices 100 will be described in accordance with at least some embodiments of the present disclosure. It should be appreciated that while certain configurations or designs are shown in certain figures, any design or feature from one illustrative example may be used in other designs without departing from the scope of the present disclosure.

Figure 5:
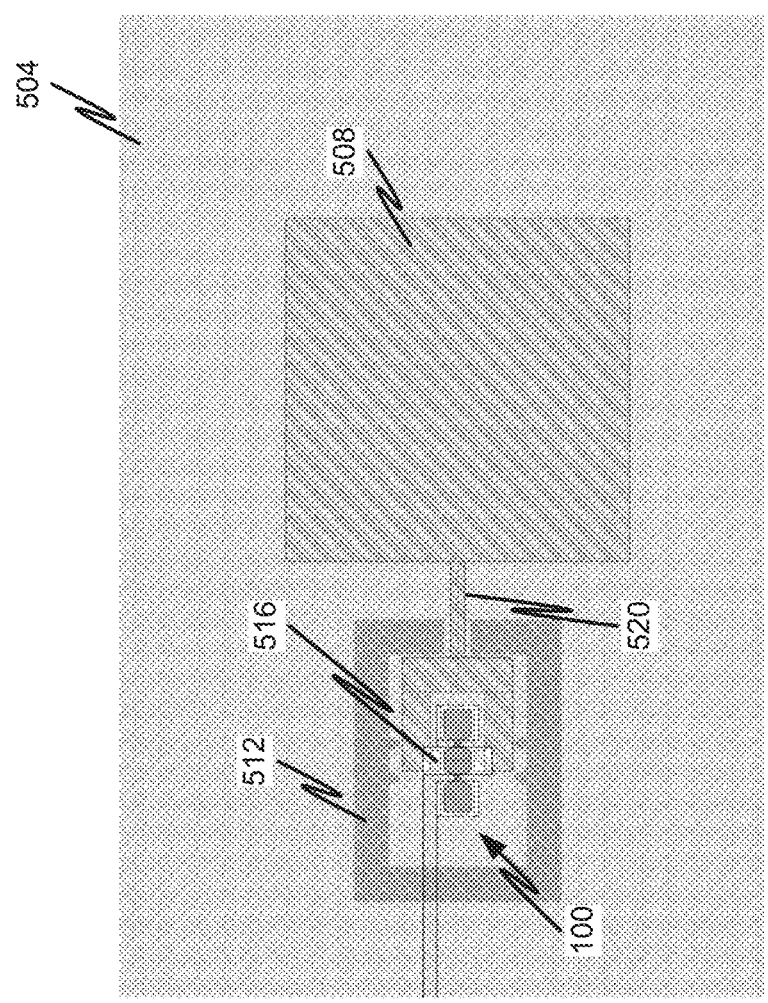
FIG. 5 is a top view of a light-emitting device in accordance with at least some embodiments of the present disclosure.
Figure 6A:
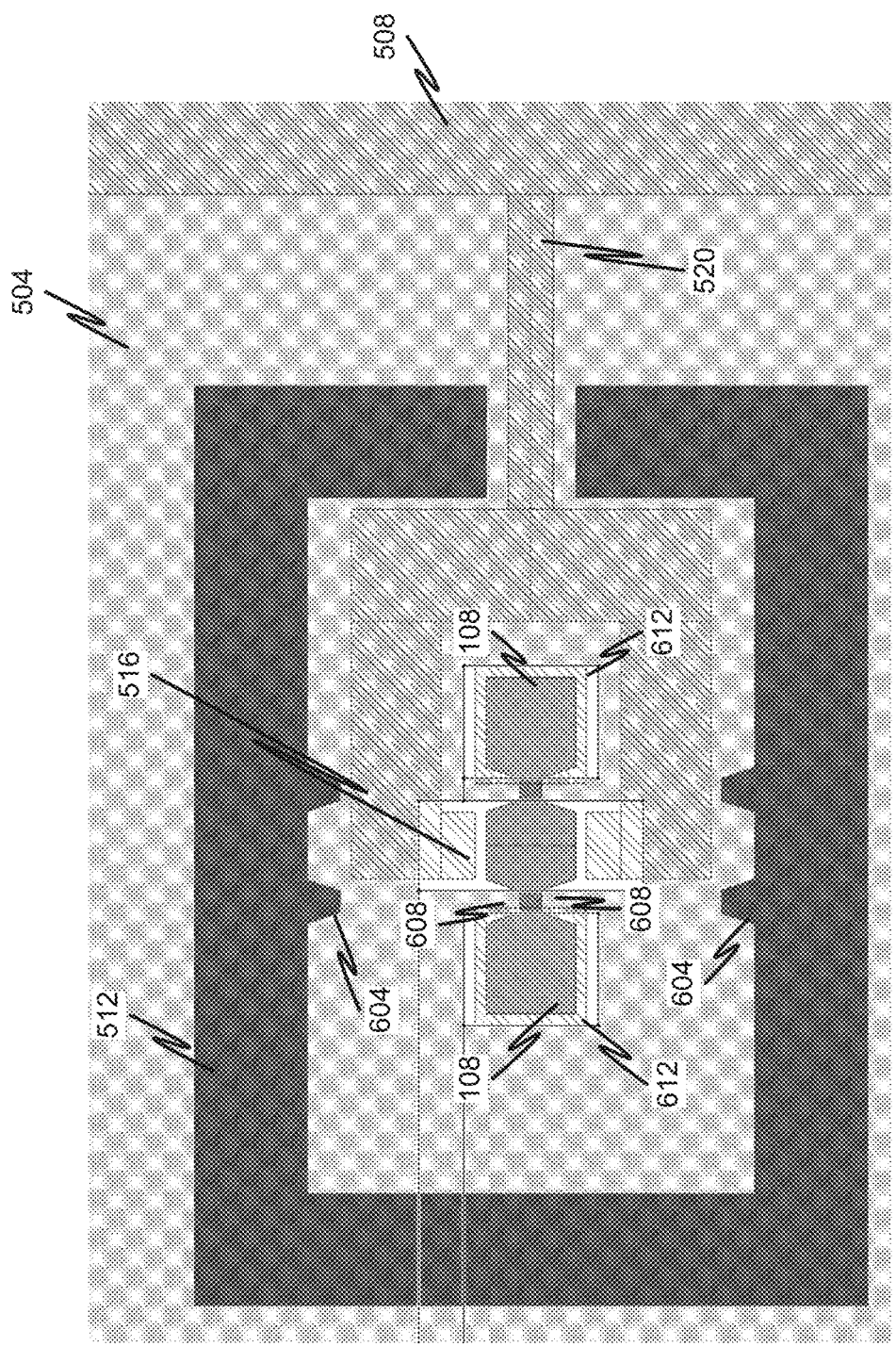
FIG. 6A is a first detailed view of the light-emitting device depicted in FIG. 5.
Figure 6B:
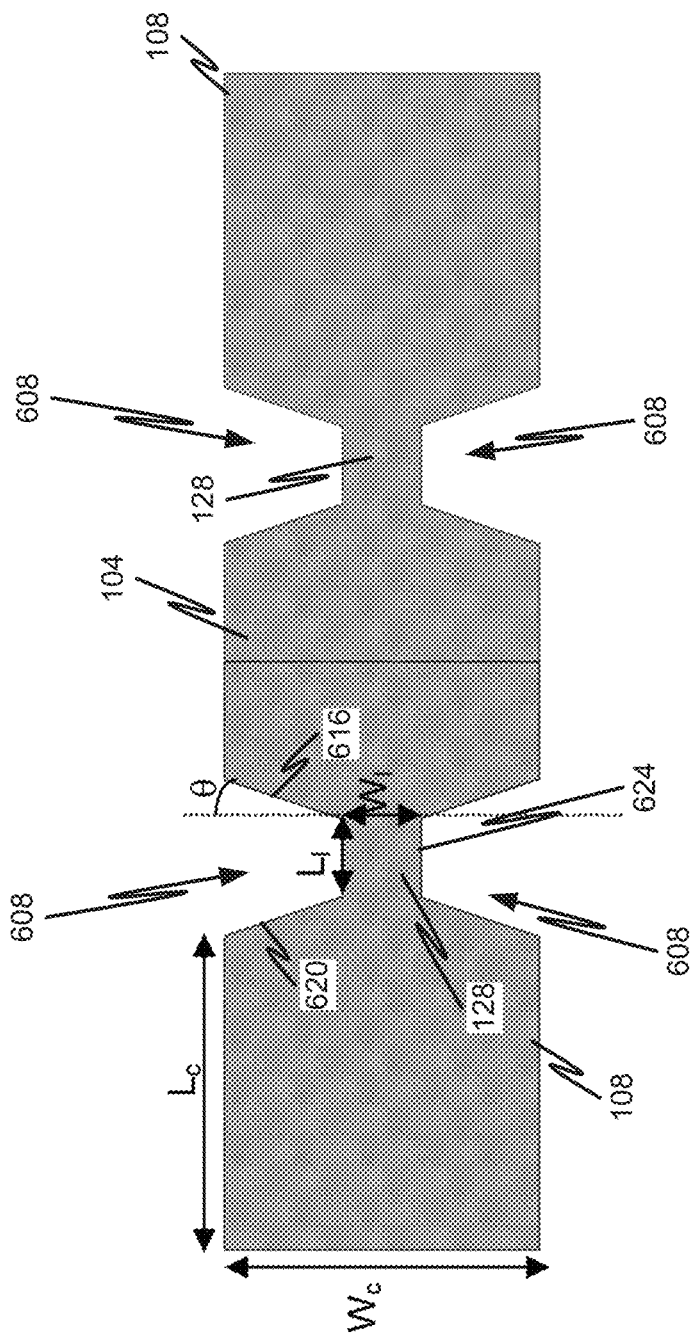
FIG. 6B is a second detailed view of the light-emitting device depicted in FIG. 5.
Figure 7:
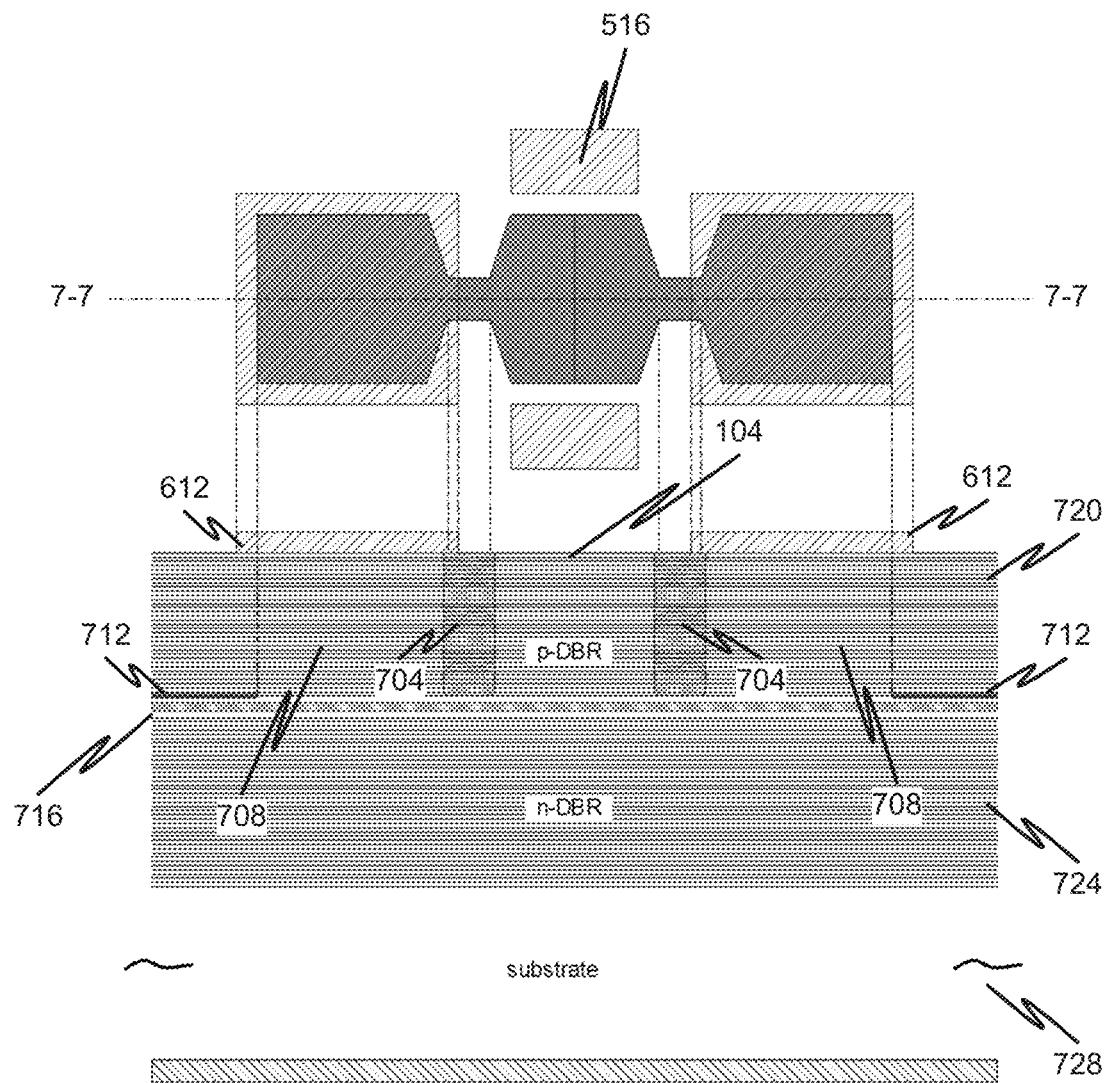
FIG. 7 is a cross-sectional view of the light-emitting device depicted in FIG. 5.

Referring initially to FIGS. 5-7, a first possible configuration of the light-emitting device 100 will be described in accordance with at least some embodiments of the present disclosure. FIG. 5 shows, from a top view, that the light-emitting device 100 is formed within an oxidation trench 512, that is situated within an implant isolation region 504. A contact pad 508 may also be provided in the implant isolation region 504 and may be connected to one or more contacts 516 via an electrical trace 520. In some embodiments, the implant isolation region 504 may correspond to an electrically insulative material. The contact pad 508, contacts 516, and trace 520 may all be formed by a common material that is conductive. As a non-limiting example, the contact pad 508, contacts 516, and trace 520 may be formed of a common metal layer formed over or within the implant isolation region 504. As can be appreciated, the contacts 516 may be positioned relative to the light-emitting device 100 so as to provide an electrical current thereto. As a non-limiting example, depending upon the nature of the device 100, the contacts 516 may correspond to p-contacts for connecting to the main cavity 104 of the light-emitting device 100. The contact pad 508 may provide a mechanism for electrically connecting the light-emitting device 100 to an external control circuit, such as a driver circuit for the light-emitting device 100. In some embodiments, the contact pad 508 may be configured to have a solder bump or wire bond connected thereto.

The trace 520 may extend through an opening in the oxidation trench 512. Other than the opening that allows the trace 520 to pass through the oxidation trench 512, the oxidation trench 512 may substantially surround the light-emitting device 100.

As can be seen in FIG. 6A, the oxidation trench 512 may include one or more trench protrusions 604. Each trench protrusion 604 may be provided at an appropriate position relative to the light-emitting device 100. In some embodiments, the trench protrusions 604 may be used to assist with the formation of one or more notches 608 in the light-emitting device 100. Each notch 608 may cause a further oxidation of the material used to form the main cavity 104 and feedback cavities 108 such that a narrowed coupling is formed between the main cavity 104 and each feedback cavity 108. In some embodiments, the size and position of the trench protrusion 604 contributes to the size and position of a notch 608 in the light-emitting device 100.

FIG. 6A also shows the positioning of the metal contacts 516 relative to the main cavity 104. In accordance with at least some embodiments, an overlapping metal 612 may be provided with a particular arrangement relative to each feedback cavity 108. Specifically, in some embodiments, each of the feedback cavities 108 may be overlapped by a corresponding p-contact overlapping metal 612. The overlapping metal 612 may be formed of the same material as the contact pad 508, contacts 516, and trace 520. In some embodiments, the overlapping metal 612 totally overlaps each feedback cavity 108 so that any light contained within a feedback cavity 108 is reflected back into the feedback cavity 108. Thus, each overlapping metal 612 area may be at least as large as each feedback cavity 108 and, in some embodiments, larger than the feedback cavity 108. As can be seen in FIG. 6A, the main cavity 104 is not overlapped by an overlapping metal area 612, thereby enabling the main cavity 104 to emit light 124 therefrom. In some embodiments, the main cavity 104 and each of the feedback cavities 108 may correspond to un-oxidized regions that are laterally bound by the oxide trench 512. These various structures may be formed using an epitaxial process or the like.

As can be seen in FIG. 6B, the particular dimensions of the light-emitting device 100 may be controlled by the dimensions of the oxidation trench 512. In some embodiments, the main cavity 104 is directly coupled to each feedback cavity 108 with a coupling 128 having a length $L_I$ and a width $W_I$. Each feedback cavity 108 may have a length $L_C$ and a width $W_C$. As discussed above, the dimensions of one feedback cavity 108 may be the same or similar as the dimensions of other feedback cavities 108, but such a configuration is not a requirement. In some embodiments, two notches 608 may bound and create un-oxidized regions 624 of a coupling 128. Each notch 608 may be formed to control the dimensions, $L_I$ and $W_I$. In some embodiments, the notch 608 may further create a separation between a portion of the main cavity wall 616 and a portion of the feedback cavity wall 620. When viewed from above, each cavity wall 616, 620 may have an offset angle $\theta$ that is measured relative to a main axis that is parallel to an outer wall of a feedback cavity 108 (or perpendicular to a main axis of the coupling 128). In some embodiments, the offset angle $\theta$ may also be controlled by the size and position of a trench protrusion 604. In some embodiments, the offset angle $\theta$ for the main cavity wall 616 may be similar or identical as the offset angle $\theta$ for each feedback cavity wall 108, although this is not a requirement. As with other dimensions of the un-oxidized region 624 of the coupling 128, the size of the offset angle $\theta$ may be controlled by the dimensions of the trench protrusion 604.

In some embodiments, the coupling coefficient, may be controlled by the dimensions of the coupling 128, namely, the offset angle $\theta$, the coupling length $L_I$, and the coupling width $W_I$. On the other hand, the dimensions and number of feedback cavities 108 may control the bandwidth enhancement provided by the feedback cavities 108 to the main cavity 104. More specifically, the feedback cavity width We and feedback cavity length $L_C$ may control or contribute to the control of the bandwidth enhancement for the light-emitting device 100.

FIG. 7 illustrates a cross-sectional view of the light-emitting device shown in FIGS. 5, 6A, and 6B across line 7-7 in accordance with at least some embodiments of the present disclosure. As can be seen in FIG. 7, the main cavity 104 and feedback cavities 108 (which are also referred to as feedback cavities 708) may be formed from common epitaxial layers. In some embodiments, the main cavity 104 may be confined by one or more implant regions 704 that isolate the main cavity 104 from the volumes of the feedback cavities 708.

Both the main cavity 104 and the feedback cavities 708 may share layers of a first doped region 20 and a second doped region 724, which are separated by an active region 716. The first doped region 720, in some embodiments, may correspond to a p-type DBR whereas the second doped region 724 may correspond to an n-type DBR. The active region 716 may correspond to a QW region that is sandwiched between the first doped region 720 and second doped region 724. Both doped regions 720, 724 and the active region 716 may be formed on top of a substrate 728, which may correspond to any type of known substrate material or combinations of materials (e.g., AlN, etc.).

FIG. 7 also illustrates the overlapping metal 612 relative to each feedback cavity 708. In some embodiments, each overlapping metal 612 may completely overlap a feedback cavity 708. The overlapping metal 612 may further partially overlap the implant region 704 that separates the main cavity 104 from a feedback cavity 708. The overlapping metal 612 may also partially overlap an oxide confinement layer 712 that bounds a feedback cavity 708.

While FIG. 7 illustrates the various overlapping metals 612 and their position relative to the feedback cavities 708, it should be noted that the metallization that would otherwise be provided to connect the p-contact 516 with the contact pad 508 (e.g., the trace 520) for the main cavity 104 is not shown in the top view of FIG. 7. This omission is for clarity purposes and is not intended to limit embodiments of the present disclosure.

Figure 8:
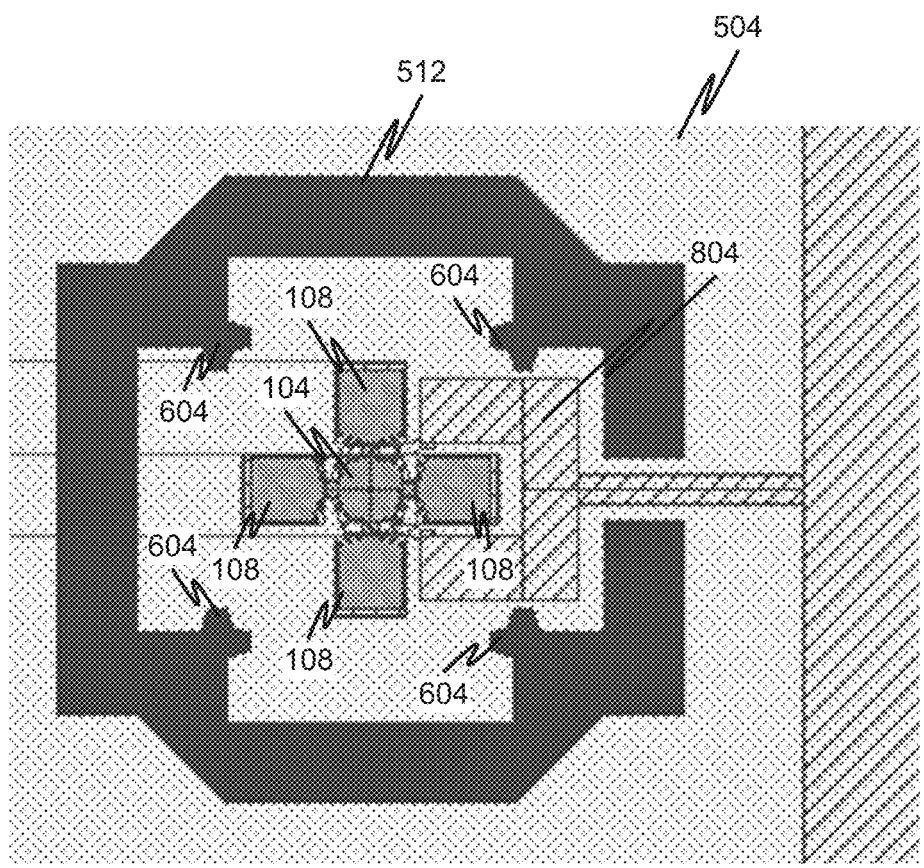
FIG. 8 is a top view of another light-emitting device in accordance with at least some embodiments of the present disclosure.
Figure 9:
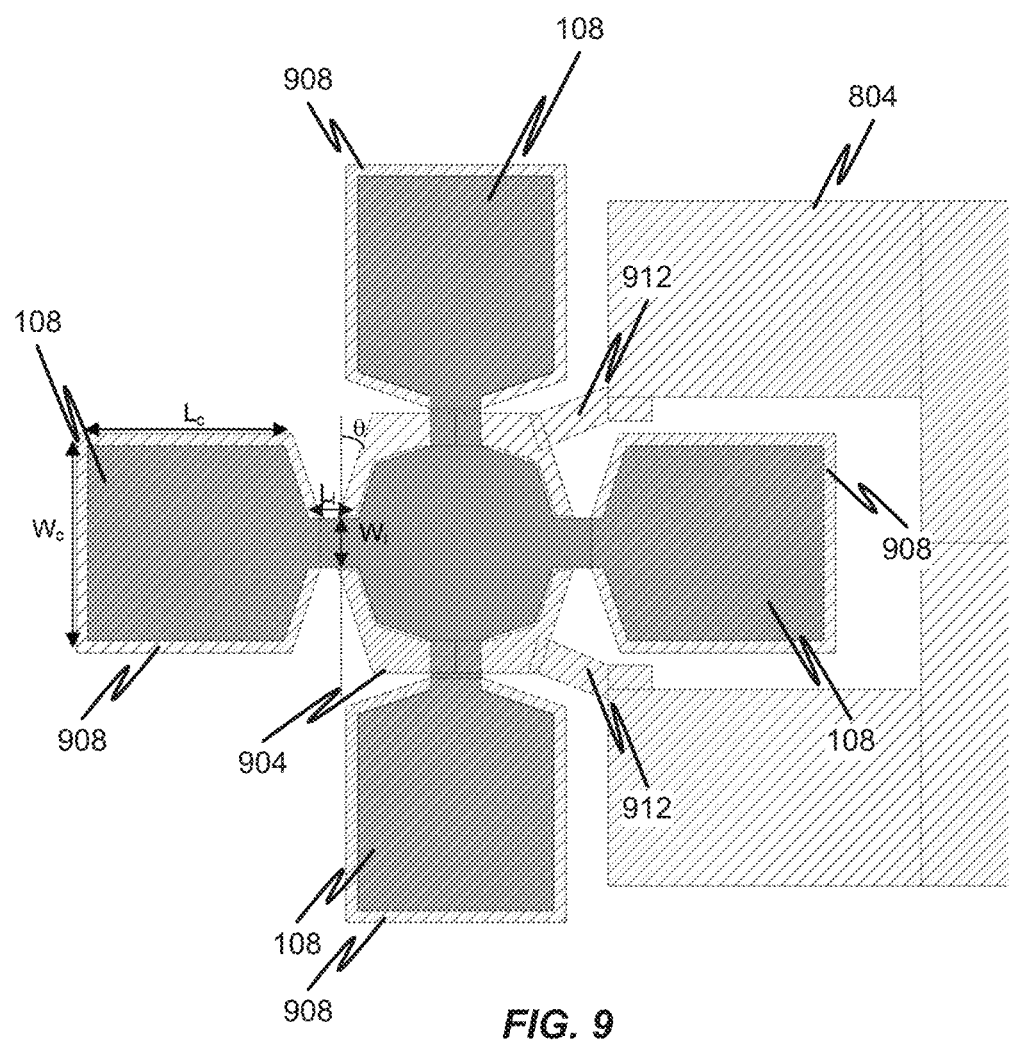
FIG. 9 is a detailed view of the light-emitting device depicted in FIG. 8.

With reference now to FIGS. 8 and 9, an alternative configuration of the light-emitting device 100 will be described in accordance with at least some embodiments of the present disclosure. This particular configuration shows the main cavity 104 as being coupled with four feedback cavities 108 rather than two feedback cavities 108 as shown in FIGS. 5-7. As shown in the top view of FIG. 8, each feedback cavity 108 is symmetrically positioned about the main cavity 104. The cavities 104, 108 are all confined by the oxidation trench 512 and the oxidation trench 604 still exhibits a number of trench protrusions 604 that facilitate the formation and dimensioning of the couplings 128 between the main cavity 104 and feedback cavities 108. In some embodiments, a metal layer 804 is provided to carry current to the light-emitting device 100 from a contact pad. The metal layer 804 may also include one or more overlapping metal areas 908 to provide light confinement for the feedback cavities 108.

In some embodiments, the metal layer 804 includes one or more metal bridges 912 that connect with a p-contact 904 positioned in proximity with the main cavity 104. The other overlapping metal areas 908 are positioned in proximity with a feedback cavity 108. It should be appreciated that each of these metal structures may be formed from a common material and, in some embodiments, may be provided at a common layer above the doped regions used to create the cavities 104, 108. In some embodiments, the metal bridge(s) 912 extend to the p-contact 904 and do not overlap the feedback cavities 108. Rather, the overlapping metals 908 are electrically isolated from the metal bridge(s) 912 and metal 904. This means that the overlapping metals 908 are provided as a light confinement structure for the feedback cavities 108 rather than functioning as a current-carrying structure for the light-emitting device 100.

In addition, it should be understood that specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. A light-emitting device, comprising:
a substrate having a first surface and an opposing second surface;
an epitaxial structure having a first surface and an opposing second surface, the second surface of the epitaxial structure being positioned in proximity with the first surface of the substrate;
a main cavity formed within the epitaxial structure and being configured to generate light in response to having an electrical current provided thereto; and
a plurality of feedback cavities also formed within the epitaxial structure, wherein each of the plurality of feedback cavities are transversely-coupled with the main cavity to receive light from the main cavity and reflect at least some feedback light back into the main cavity.

2. The light-emitting device of claim 1, wherein the plurality of feedback cavities comprises a first feedback cavity and a second feedback cavity.

3. The light-emitting device of claim 2, wherein the first feedback cavity comprises a length that is no greater than 10 µm and wherein the second feedback cavity comprises a length that is no greater than 10 µm.

4. The light-emitting device of claim 3, wherein the length of the first feedback cavity is substantially equal to the length of the second feedback cavity.

5. The light-emitting device of claim 2, wherein the first feedback cavity is coupled to the main cavity with a first coupling and wherein the second feedback cavity is coupled to the main cavity with a second coupling.

6. The light-emitting device of claim 5, wherein the first feedback cavity and second feedback cavity are cascade-coupled such that the second coupling is provided between the first feedback cavity and the second feedback cavity.

7. The light-emitting device of claim 5, wherein the first feedback cavity and second feedback cavity are both directly coupled with the main cavity such that the first coupling is provided directly between the main cavity and the first feedback cavity and such that the second coupling is provided directly between the main cavity and the second feedback cavity.

8. The light-emitting device of claim 7, wherein the first feedback cavity and the second feedback cavity are arranged substantially symmetrically about the main cavity.

9. The light-emitting device of claim 5, wherein the first coupling comprises a coupling strength of at least 0.5 and wherein the second coupling comprises a coupling strength of at least 0.5.

10. The light-emitting device of claim 1, further comprising a plurality of overlapping metal areas that are positioned relative to the plurality of feedback cavities to prevent light emission from each of the plurality of feedback cavities.

11. The light-emitting device of claim 1, wherein the epitaxial structure comprises a first distributed Bragg reflector (DBR) stack, a second DBR stack, and a quantum well (QW) region sandwiched between the first DBR stack and second DBR stack.

12. The light-emitting device of claim 1, wherein the main cavity comprises a vertical cavity surface emitting laser (VCSEL).

13. The light-emitting device of claim 1, wherein the plurality of feedback cavities comprises at least three feedback cavities.

14. The light-emitting device of claim 13, wherein the at least three feedback cavities are spaced equally around the main cavity.

15. A semiconductor device, comprising:
a substrate; and
a vertical cavity surface emitting laser (VCSEL) formed on the substrate, wherein laser light produced by the VCSEL is generated within a main cavity and emitted away from the substrate, and wherein the main cavity is transversely-coupled with a plurality of feedback cavities such that at least some light produced within the main cavity enters the plurality of feedback cavities via the transverse coupling.

16. The semiconductor device of claim 15, wherein each feedback cavity in the plurality of feedback cavities is directly coupled with the main cavity by a discrete coupling.

17. The semiconductor device of claim 15, wherein the plurality of feedback cavities comprises a first, second, third, and fourth feedback cavity, wherein each of the first, second, third, and fourth feedback cavities are arranged substantially symmetrically with respect to the main cavity, and wherein each of the first, second, third, and fourth feedback cavities are overlapped by an overlapping metal that prevents light emission from each of the first, second, third, and fourth feedback cavities.

18. The semiconductor device of claim 15, wherein the plurality of feedback cavities comprises a first feedback cavity and a second feedback cavity, wherein a length of the first feedback cavity is no greater than 10 µm and wherein a length of the second feedback cavity is no greater than 10 µm.

19. A vertical cavity surface emitting laser (VCSEL), comprising:
an epitaxial structure;
a contact layer positioned in proximity to the epitaxial structure;
a main cavity formed within the epitaxial structure and being configured to generate laser light in response to having an electrical current provided thereto from the contact layer; and
a plurality of feedback cavities also formed within the epitaxial structure, wherein each of the plurality of feedback cavities are transversely-coupled with the main cavity to receive light from the main cavity that has reflected within the main cavity.

20. The VCSEL of claim 19, wherein the plurality of feedback cavities comprises a first feedback cavity and a second feedback cavity, wherein the first feedback cavity comprises a length that is no greater than 10 µm, and wherein the second feedback cavity comprises a length that is no greater than 10 µm.

* * * * *